(12) United States Patent
Donkers et al.

(10) Patent No.: US 8,101,491 B2
(45) Date of Patent: Jan. 24, 2012

(54) HETEROJUNCTION BIPOLAR TRANSISTOR

(75) Inventors: Johannes Josephus Theodorus Marinus Donkers, Valkenswaard (NL); Tony Vanhoucke, Bierbeek (BE); Hans Mertens, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/912,030

(22) Filed: Oct. 26, 2010

(65) Prior Publication Data
US 2011/0121364 A1 May 26, 2011

(30) Foreign Application Priority Data
Oct. 26, 2009 (EP) ..................................... 09174032

(51) Int. Cl.
*H01L 29/737* (2006.01)
*H01L 21/331* (2006.01)

(52) U.S. Cl. .......... 438/318; 438/312; 257/19; 257/197; 257/616; 257/E29.188

(58) Field of Classification Search .................. 438/318, 438/312; 257/197, 19, 616
See application file for complete search history.

(56) References Cited

U.S. PATENT DOCUMENTS

| | | | |
|---|---|---|---|
| 7,074,685 B2 | 7/2006 | Magnee et al. | |
| 7,534,679 B2 | 5/2009 | Rochel et al. | |
| 7,772,097 B2 * | 8/2010 | Tomasini et al. | 438/505 |
| 2002/0197809 A1 * | 12/2002 | Asai et al. | 438/312 |
| 2004/0092076 A1 | 5/2004 | Idota et al. | |
| 2004/0157387 A1 | 8/2004 | Yi et al. | |
| 2004/0166645 A1 * | 8/2004 | Shideler | 438/312 |
| 2005/0218399 A1 * | 10/2005 | Magnee et al. | 257/19 |
| 2006/0014334 A1 * | 1/2006 | J.R.P. Augusto et al. | 438/154 |
| 2006/0043529 A1 * | 3/2006 | Chidambarrao et al. | 257/565 |

FOREIGN PATENT DOCUMENTS
WO 2005/109495 A1 11/2005

OTHER PUBLICATIONS

Hashimoto T. et, al.: 'High-Speed scaled-down self-aligned SEG SiGe HBTs,' IEEE Transactions on Electron Devices, vol. 50 No. 12, pp. 2417-2424, (Dec. 1, 2003).
Extended European Search Report for Patent Application No. 09174032.4 (Mar. 18, 2010).

* cited by examiner

*Primary Examiner* — Alexander Ghyka

(57) ABSTRACT

According to an example embodiment, a heterostructure bipolar transistor, HBT, includes shallow trench isolation, STI, structures around a buried collector drift region in contact with a buried collector. A gate stack including a gate oxide and a gate is deposited and etched to define a base window over the buried collector drift region and overlapping the STI structures. The etching process is continued to selectively etch the buried collector drift region between the STI structures to form a base well. SiGeC may be selectively deposited to form epitaxial silicon-germanium in the base well in contact with the buried collector drift region and poly silicon-germanium on the side walls of the base well and base window. Spacers are then formed as well as an emitter.

11 Claims, 4 Drawing Sheets

HETEROJUNCTION BIPOLAR TRANSISTOR

This application claims the priority under 35 U.S.C. §119 of European patent application no. 09174032.4, filed on Oct. 26, 2009, the contents of which are incorporated by reference herein.

FIELD OF THE INVENTION

The invention relates to a hetero junction bipolar transistor (HBT) and method of its manufacture.

BACKGROUND OF THE INVENTION

A number of approaches to the manufacture of HBTs have been proposed. In particular, US2005/0218399 (Philips) proposes a method of fabricated a SiGeC HBT. In the approach described, as illustrated in FIG. 1, shallow trench isolation (STI) structures 104 are provided on either side of a collector drift region 102 that will form part of the collector. A stack 106 is then formed over the STI structures 104 overlapping region 102, and etched to define a base window or opening.

A layer 108 is then grown in the base window using a non-selective epitaxial process that grows epitaxial SiGeC 110 above the collector region and poly SiGeC 112 on the sidewalls and base of the base window.

After several further process steps, forming an insulator 116, a silicon emitter 114 is formed within the opening, resulting in the stage shown in FIG. 1.

This process has the advantage that the fabrication process can provide a cost-effective solution compared with high performance HBT approaches.

However, there remains a desire for one or more of a further reduction in the size of HBTs, the ease of HBT manufacture, and also the enhancement the figures of merit of an HBT, such as maximum oscillation frequency, bandwidth, and minimum noise. These figures of merit are related to properties of the HBT, including the collector-base capacitance and total base resistance.

SUMMARY

According to an embodiment of the invention, there is a method of manufacture of a hetero-structure bipolar transistor, HBT. The method comprises defining shallow trench isolation, STI, structures in a substrate around a buried collector drift region, the buried collector drift region being in contact with a buried collector. A gate stack including a gate oxide, a gate, and a gate insulator, is deposited above the gate. The gate stack is etched to define a base window over the buried collector drift region and overlapping the STI structures; and continuing, the buried collector drift region between the STI structures to form a base well between the STI structures is selectively etched. Silicon-germanium is selectively deposited in the base well and in the base window to form epitaxial silicon-germanium in the base well in contact with the buried collector drift region and poly silicon-germanium on the side walls of the base well and base window. An insulator is formed on the inner sidewalls of the poly-silicon germanium. Above the epitaxial silicon germanium and inside the insulator on the inner sidewalls an emitter is formed.

By overlapping the base window with the STI structures the formation of the epitaxial silicon-germanium can be made self-aligned with the collector drift region. This allows for ease of manufacture, and permits improved properties.

In particular the method of manufacturing is fully compatible with conventional CMOS processing. The bipolar device is manufactured before the CMOS gates are patterned and the critical CMOS implantations are carried out. This means that the temperature budget of the bipolar manufacturing does not influence the CMOS parameters. This way of integration is highly advantageous for any process where the baseline CMOS performance cannot be compromised.

The gate stack may further include an insulator above the gate and a poly silicon layer on the top of the gate stack. The silicon-germanium forms a poly-silicon germanium layer where deposited on top of the poly-silicon and epitaxial silicon germanium where deposited on top of the crystalline collector drift region.

The deposited silicon-germanium may further comprise carbon. This can reduce the out-diffusion from the boron-doped base during subsequent CMOS processing steps, in particular the temperature processing associated with such CMOS steps.

In embodiments, the buried collector extends under the STI structures and the collector drift region. In such embodiments, the thinned collector drift region provides improved high-frequency properties.

In embodiments, the buried collector may extend under the STI structures and the collector drift region extends below the STI structures to be in contact with the buried collector. In such embodiments, the thicker collector drift region provides improved high voltage properties.

In another aspect, there is provided a HBT having shallow trench isolation, STI, structures in a substrate around a buried collector drift region; the buried collector drift region is in contact with a buried collector. A gate stack includes a gate oxide and a gate over the STI structures. There is a base window over the buried collector drift region and overlapping the STI structures and a base well between the STI structures. Epitaxial silicon-germanium is in the base well and in contact with the buried collector drift region and poly-silicon-germanium is on the side walls of the base well and base window. On the inner sidewalls of the poly-silicon germanium is an insulator. An emitter is above the epitaxial silicon germanium inside the insulator on the inner sidewalls

BRIEF DESCRIPTION OF THE DRAWINGS

For a better understanding of the invention, embodiments will now be described, purely by way of example, with reference to the accompanying drawings, in which.

The figures are schematic and not to scale. Like or corresponding components are given the same reference numbers in different figures and the description relating thereto is not necessarily repeated.

DETAILED DESCRIPTION

Figure 1:
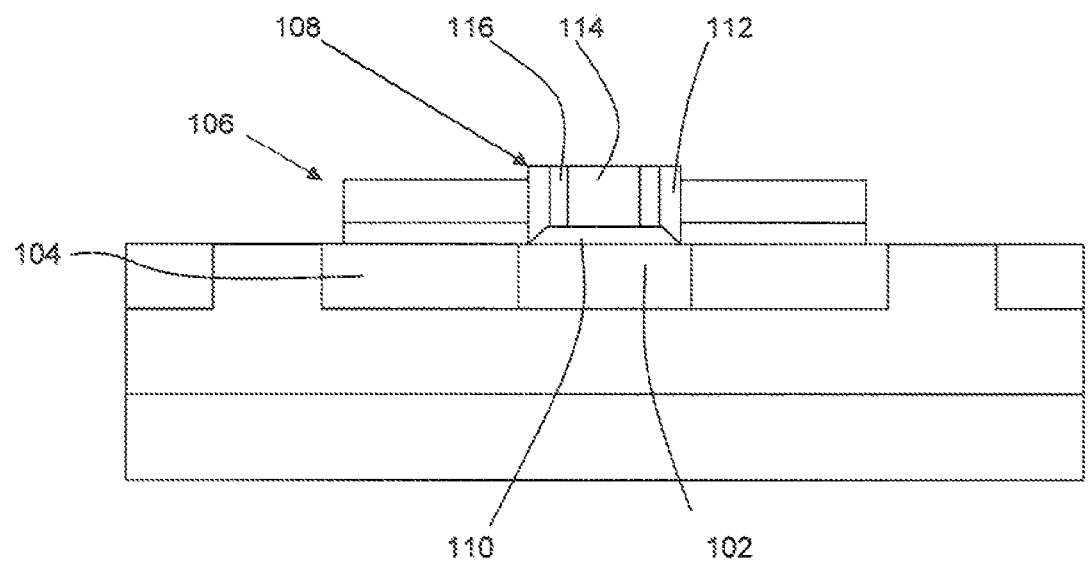
FIG. 1 shows a prior art method.
Figure 2:
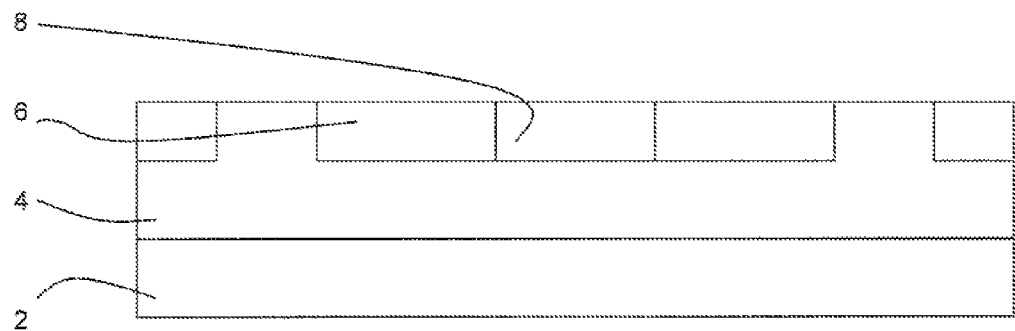
FIGS. 2 to 4 show a method according to a first embodiment of the invention.

Referring to FIG. 2, a silicon substrate 2 is formed to have a doped buried collector region 4. STI structures 6 surround a buried collector drift region 8 with a lower doping than the buried collector region 4. The buried collector region 4 is brought to the surface of the substrate to allow contact to it. The manufacture of STI structures is well known in the art and will not be described further.

Figure 3:
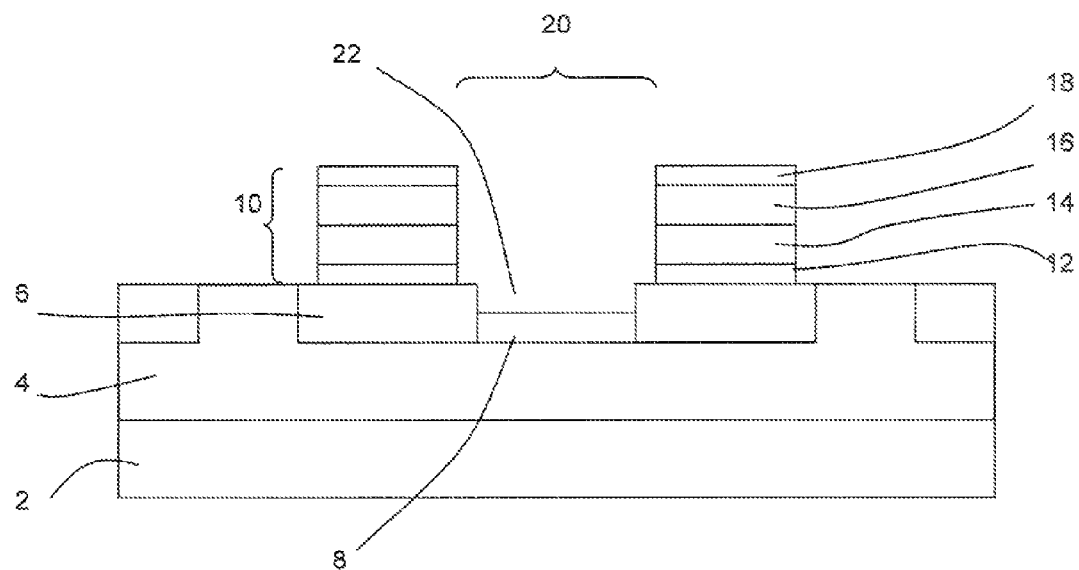

Referring to FIG. 3, a gate stack 10 is then formed. Firstly, a gate insulator 12 of thermal oxide is formed, followed by a deposited gate region 14 which may for example be of poly-silicon. The poly-silicon is doped to be conductive, in the specific embodiment after deposition. In alternative embodiments the poly-silicon is in-situ doped.

An insulator 16 is then deposited, in the embodiment of silicon nitride, though in alternative arrangements silicon oxide or TEOS (tetraethyl—orthosilicate) may be used. Then a top poly-silicon layer 18 is deposited, which in the present embodiment may function an epi defect getter layer. Note that this layer may be omitted if not required.

The gate stack is then patterned using photo-resist (not shown) to define a base window 20. The base window 20 overlaps the STI structures 6. The amount of overlap is not critical, but in the embodiment the degree of overlap may be defined by the overlay specification. For a typical deep UV resist process the overlay specification may be 50 nm in which case the overlap in the design should be at least 50 nm to ensure that an overlap is created in the finished product.

A silicon etching step is then carried out using a dry etch, followed by an in-situ HCL etch in a epi reactor to repair the surface before the epitaxial growth begins. This dry etch is selective in that it selectively etches silicon compared with silicon dioxide. The etching step starts by etching through the gate insulator 12 and then is allowed to continue to selectively etch the buried collector drift region 8 between the silicon dioxide of the STI structures 6 to form a base well 22 between the STI structures 6 and extending, in the embodiment, about half of the depth of the STI structures 6 (FIG. 3).

This choice of dry etch followed by a HCl pre-epi treatment allows good epitaxial growth, but alternative etches may be used where appropriate. The depth of the base well 22 may be adjusted where appropriate to adjust the properties of the finished device.

A silicon-germanium-carbon layer 24 is then deposited by a non-selective epitaxial growth process as set out in US2005/0218399. Epitaxial silicon-germanium-carbon 26 is formed where the deposition takes place over the epitaxial silicon of the buried collector drift region 8 and poly-silicon-germanium carbon 28 is formed on the sidewalls and in particular over the top poly-silicon layer 18 which acts as a seed layer.

Processing then continues as in the process of US2005/0218399. The poly-silicon-germanium-carbon 28 is removed from the top of the gate stack along with the top poly-silicon 18 and the insulating layer 16. Insulating spacers 32 of nitride, oxide, or both, is formed in the silicon-germanium-carbon, followed by an arsenic in-situ doped poly-silicon layer 34 forming the emitter.

The form of the spacers 32 and emitter 34 will depend on the processing but in embodiments the emitter is tapered to be slightly wider towards the top.

Further processing then forms contacts to the gate 14, buried collector 6 and emitter 34.

In this way, the formation of the epitaxial silicon-germanium-carbon is effectively self-aligned to the base well 22. This increase in self-alignment makes processing much easier. In particular, it is possible to be much more aggressive with lateral scaling which reduces the base-collector capacitance and base resistance with the same process rules.

The emitter 34 is tapered to have greater width at the top than adjacent to the base and this allows improved performance for the same top width. This still further reduces the base-collector capacitance and base resistance.

A further benefit is that the risk of gate-oxide breakdown is much reduced compared with US2005/0218399, so a thinner gate oxide can be used. These benefits make the HBT more scalable for future CMOS generations.

Further, the embodiment reduces the collector resistance. This is beneficial for high performance devices, i.e. high speed devices.

If it is desired to include high voltage and high performance devices on a single chip, a mask is usually already provided to provide extra dopant in the form of an extra high-doped collector region for the high performance devices. If required, the additional etch to form the base well 22 can be carried out only on the high-performance devices, leaving a greater thickness of buried collector 6 on the high-voltage devices. An extra collector implantation can then take place in the same high-performance devices. The base window etch can then be performed separately for the high voltage devices with a less deep base well 22 or even no base well 22 at all. Such a high voltage device is shown in FIG. 5.

As for the base resistance, the resistance path from gate 14 to base 26 is a little longer, but since the epitaxial silicon-germanium-carbon 26 is associated with a reduced resistance, the overall base resistance is reduced.

Figure 4:
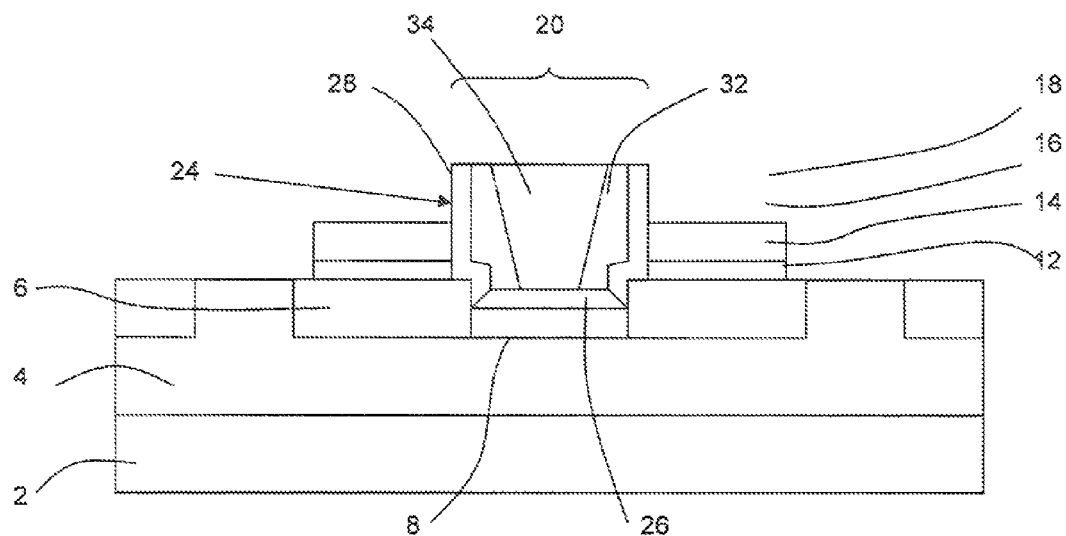
Figure 5:
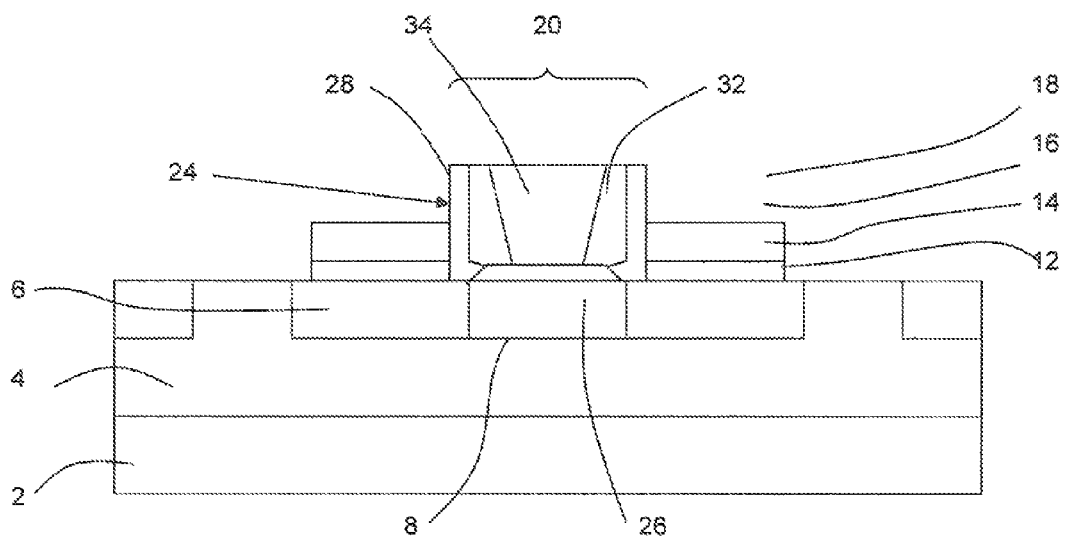
FIG. 5 shows a method which may be used to manufacture additional devices in the same method as used to manufacture the embodiment of FIGS. 2 to 4.
Figure 6:
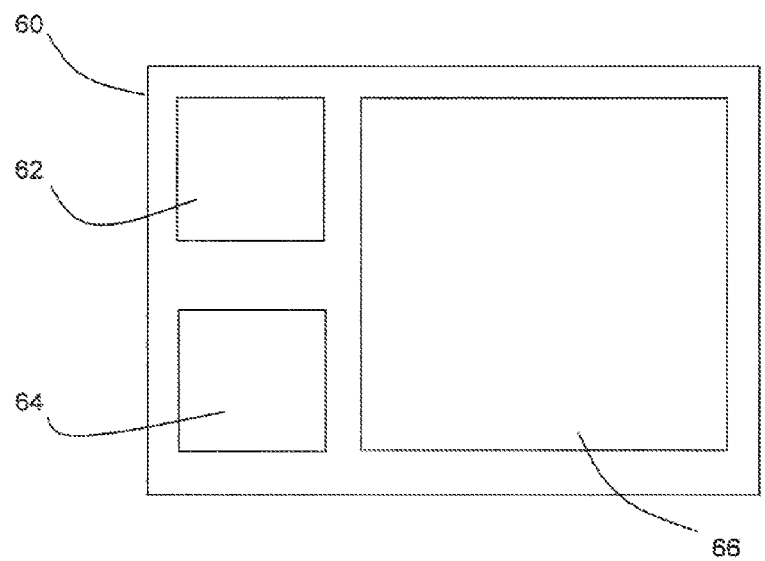
FIG. 6 shows a device including different HBT devices as well as a CMOS circuit.

As illustrated in FIG. 6, a semiconductor device 60 may accordingly include a high voltage HBT 62 as shown in FIG. 5, a high performance HBT 64 as shown in FIG. 4 and a CMOS circuit 66 all manufactured in the same process. The high voltage HBT is distinguished from the high performance HBT by not having a base well 22 or by having a thinner base well as discussed above. Alternatives may omit the high voltage HBT 62 or CMOS circuit 66.

Figure 7:
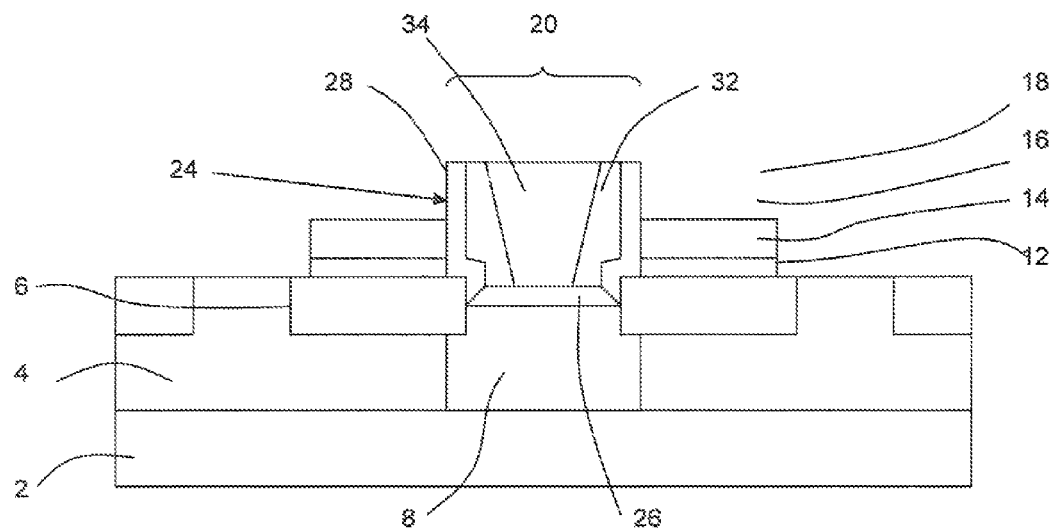
FIG. 7 shows a method according to a second embodiment of the invention.

An alternative embodiment with a higher thickness buried collector drift region 8 will now be explained with regard to FIG. 7.

In this embodiment, the buried collector drift region 8 extends downwards below the depth of the STI structures 6 so that the buried collector 4 does not extend below the buried collector drift region 8 but is provided laterally to one side of it. This reduces the net doping under the active device and increases the breakdown voltage.

A number of further variations are possible. In particular, it is possible to manufacture either n-type or p-type HBTs with suitable choice of doping.

The choice of materials may be varied. For example, insulating layers and semiconductor materials may be replaced by other insulating material and semiconductor materials respectively.

The invention claimed is:

1. A method of manufacture of a heterostructure bipolar transistor, HBT, comprising:
    defining shallow trench isolation, STI, structures in a substrate around a buried collector drift region, the buried collector drift region being in contact with a buried collector;
    depositing a gate stack including a gate oxide, a gate, and a gate insulator above the gate;
    etching the gate stack to define a base window over the buried collector drift region and overlapping the STI structures and continuing to selectively etch the buried collector drift region between the STI structures to form a base well between the STI structures;
    selectively depositing silicon-germanium in the base well and in the base window to form epitaxial silicon-germanium in the base well in contact with the buried collector drift region and poly silicon-germanium on the side walls of the base well and base window;

forming insulator on the inner sidewalls of the poly-silicon germanium; and forming an emitter above the epitaxial silicon germanium and inside the insulator on the inner sidewalls.

2. A method according to claim 1, wherein the gate stack further includes an epi defect getter layer on the top of the gate stack.

3. A method according to claim 1, wherein the deposited silicon-germanium further comprises carbon.

4. A method according to claim 1, wherein the buried collector extends under the STI structures and the buried collector drift region.

5. A method according to claim 1, wherein the buried collector extends under the STI structures and the buried collector drift region extends below the STI structures to be in contact with the buried collector.

6. A hetero-structure bipolar transistor, HBT, comprising:
 shallow trench isolation, STI, structures in a substrate around a buried collector drift region, the buried collector drift region being in contact with a buried collector;
 a gate stack including a gate oxide and a gate over the STI structures;
 a base window over the buried collector drift region and overlapping the STI structures and a base well between the STI structures;
 epitaxial silicon-germanium in the base well in contact with the buried collector drift region and poly-silicon-germanium on the side walls of the base well and base window;
 insulator on the inner sidewalls of the poly-silicon germanium; and
 an emitter above the epitaxial silicon germanium inside the insulator on the inner sidewalls.

7. A HBT according to claim 6, wherein the silicon-germanium further comprises carbon.

8. A HBT according to claim 6, wherein the buried collector extends under the STI structures and the buried collector drift region.

9. A HBT according to claim 6, wherein the buried collector extends under the STI structures and the buried collector drift region extends below the STI structures to be in contact with the buried collector.

10. A HBT according to claim 6, wherein the gate stack further includes an epi defect getter layer on the top of the gate stack.

11. A semiconductor device comprising at least one HBT according to claim 6 and at least one CMOS device.

\* \* \* \* \*